United States Patent
Ruby et al.

(10) Patent No.: US 9,042,184 B2
(45) Date of Patent: May 26, 2015

(54) NON-VOLATILE MEMORY PROGRAMMING

(71) Applicant: Micron Technology, Inc., Boise, ID (US)

(72) Inventors: Paul D. Ruby, Folsom, CA (US); Violante Moschiano, Bacoli (IT); Giovanni Santin, Rieti (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/925,192

(22) Filed: Jun. 24, 2013

(65) Prior Publication Data

US 2013/0286743 A1 Oct. 31, 2013

Related U.S. Application Data

(62) Division of application No. 12/778,838, filed on May 12, 2010, now Pat. No. 8,472,256.

(51) Int. Cl.
*G11C 16/06* (2006.01)
*G11C 16/10* (2006.01)
*G11C 11/56* (2006.01)
*G11C 16/04* (2006.01)
*G11C 16/34* (2006.01)

(52) U.S. Cl.
CPC ............ *G11C 16/10* (2013.01); *G11C 11/5628* (2013.01); *G11C 16/0483* (2013.01); *G11C 16/3418* (2013.01)

(58) Field of Classification Search
CPC .......................... G11C 16/10; G11C 16/3454
USPC ....................... 365/185.19, 185.22, 185.28
See application file for complete search history.

(56) References Cited

U.S. PATENT DOCUMENTS

| | | | |
|---|---|---|---|
| 7,324,383 B2 | 1/2008 | Incarnati et al. | |
| 8,472,256 B2 | 6/2013 | Ruby et al. | |
| 2006/0285392 A1* | 12/2006 | Incarnati et al. | 365/185.22 |
| 2008/0094912 A1 | 4/2008 | Incarnati et al. | |
| 2008/0239824 A1 | 10/2008 | Sekar et al. | |
| 2009/0010068 A1* | 1/2009 | Lee | 365/185.19 |
| 2010/0165739 A1 | 7/2010 | Moschiano et al. | |
| 2011/0280082 A1 | 11/2011 | Ruby et al. | |

* cited by examiner

*Primary Examiner* — Hoai V Ho
(74) *Attorney, Agent, or Firm* — Schwegman Lundberg & Woessner, P.A.

(57) ABSTRACT

Some embodiments include a memory device and a method of programming memory cells of the memory device. One such method includes applying voltages to data lines associated with different groups of memory cells during a programming operation. Such a method applies the voltages to the data lines associated with a last group of memory cells being programmed in a different fashion from the other groups of memory cells after the other groups of memory cells have been programmed. Other embodiments including additional memory devices and methods are described.

16 Claims, 8 Drawing Sheets

NON-VOLATILE MEMORY PROGRAMMING

PRIORITY APPLICATION

This application is a divisional of U.S. application Ser. No. 12/778,838, filed May 12, 2010, which is incorporated herein by reference in its entirety.

BACKGROUND

Non-volatile memory devices such as flash memory devices are used in many computers and electronic devices to store data or information. A flash memory device usually has a programming operation to store data, a read operation to retrieve the stored data, and an erase operation to clear data from the memory. These programming, read, and erase operations often involve applying various voltages to different parts of the memory device.

A conventional non-volatile memory device may go through many programming, read, and erase operations during its life. Thus, improper control of the voltages applied to the device during these operations may lead to inferior device performance, reliability, or both.

DETAILED DESCRIPTION

Figure 1:
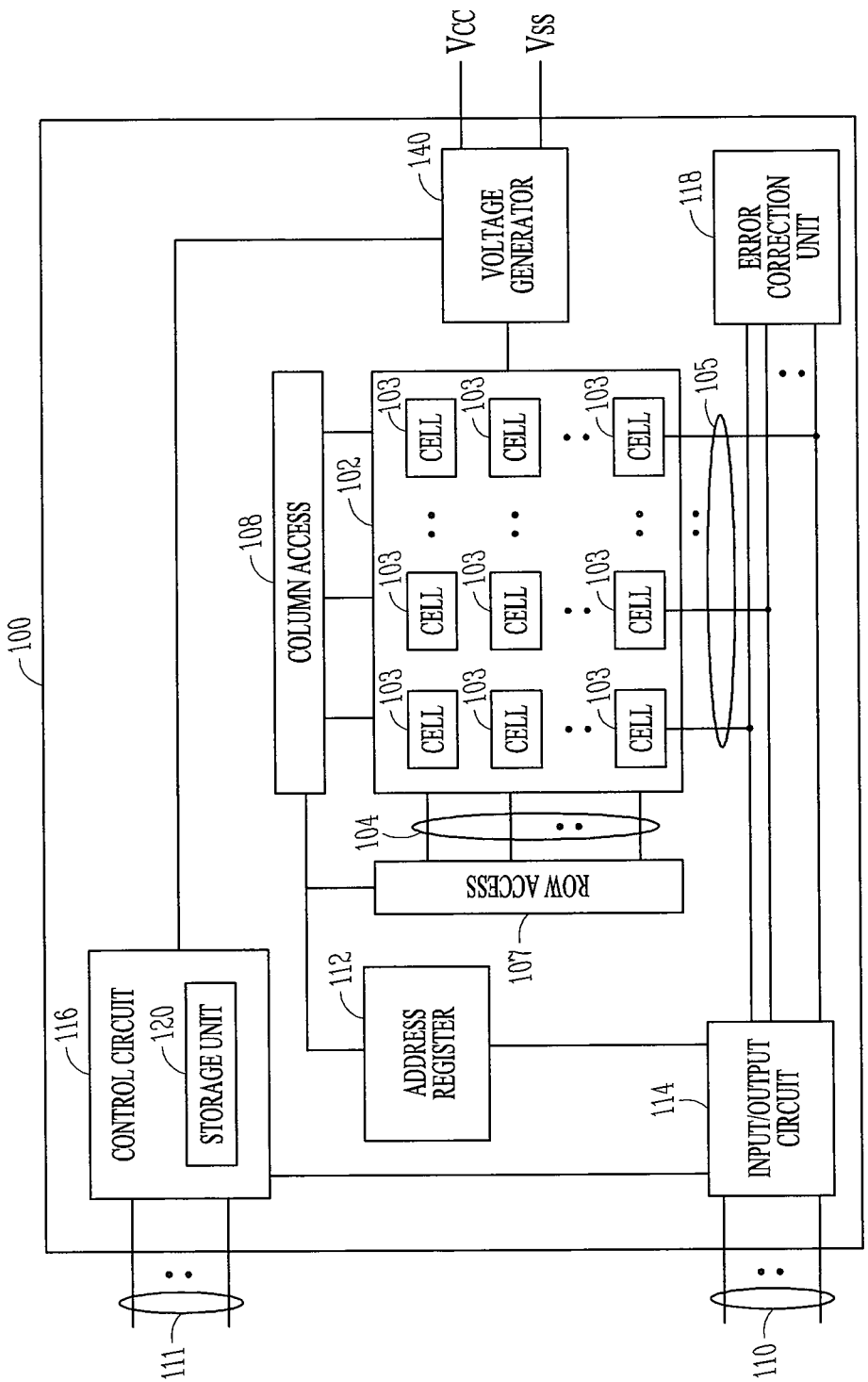
FIG. 1 shows a block diagram of a memory device, according to an embodiment of the invention.

FIG. 1 shows a block diagram of a memory device 100 according to an embodiment of the invention. Memory device 100 includes a memory array 102 with memory cells 103 that may be arranged in rows and columns along with access lines 104 and data lines 105. Memory device 100 can use access lines 104 to access memory cells 103 and data lines 105 to transfer information with memory cells 103. Row access 107 and column access circuitry 108 respond to an address register 112 to access memory cells 103 based on row address and column address signals on terminals 110, 111, or both. A data input/output circuit 114 transfers data between memory cells 103 and terminals 110. Terminals 110 and 111 may be external terminals of memory device 100 (e.g., terminals exposed outside a chip or semiconductor package that contains memory device 100).

A control circuit 116 controls operations of memory device 100 based on signals present on terminals 110 and 111. A device (e.g., a processor or a memory controller) external to memory device 100 may send different commands (e.g., programming commands and read commands) to memory device 100 using different combinations of signals on terminals 110, 111, or both.

Memory device 100 responds to commands to perform operations such as programming, read, and erase operations. A programming operation may write data from terminals 110 to memory cells 103 (e.g., transfer data from terminals 110 to memory cells 103). The programming operation can generally be called a write operation. A read operation reads data from memory cells 103 to terminals 110 (e.g., transfer data from memory cells 103 to terminals 110). An erase operation erases data (e.g., clears data) from all memory cells 103 or from a portion of memory cells 103.

Memory device 100 receives supply voltages Vcc and Vss. Vcc may include a positive voltage value, and Vss may include a ground potential. Memory device 100 can also include a voltage generator 140. Voltage generator 140 and control circuit 116 operate to provide different voltages to memory array 102 or to cause memory array 102 to receive different voltages during the operations (e.g., programming operations) of memory device 100.

Memory device 100 may include an error correction unit 118 to check for errors in information read from memory cells 103. Error correction unit 118 may include error correction circuitry to correct errors based on an error correction code (ECC), as is well-known to those of ordinary skill in the art.

Memory device 100 may include a storage unit 120, which may include memory elements such as registers. Storage unit 120 may include a hardware portion, a firmware portion, or both, of memory device 100. Storage unit 120 may also be used to store codes (e.g., software programming instructions).

Memory device 100 can be a flash memory device such as a NAND flash or a NOR flash memory device, and other kinds of memory devices.

Memory device 100 can be a single-level-cell memory device such that memory cells 103 store information to represent a value of a single bit of data. For example, memory cells 103 may store information that represents either a binary "0" value or a binary "1" value of a single bit of data.

Memory device 100 can be a multi-level-cell (MLC) memory device such that each of memory cells 103 can store information represented by a value corresponding to multiple bits of data (e.g., a value corresponding to two, three, four, or some other number of bits of data). For example, when each of memory cells 103 corresponds to a 2-bit per cell, each of memory cells 103 may store information to represent a value corresponding to one of four possible combinations of two binary bits of data (i.e., combination 00, 01, 10, and 11 corresponding to two bits of data). In another example, when each of memory cells 103 corresponds to a 3-bit per cell, each of memory cells 103 may store information to represent a value corresponding to one of eight possible combinations of three binary bits of data (i.e., one of 000, 001, 010, 011, 100, 101, 110, and 111). In another example, when each of memory cells 103 corresponds to a four-bit per cell, each of memory cells 103 may store information to represent one of 16 possible combinations of four binary bits of data (i.e., one of 0000, 0001, 0010, 0011, 1000, and so on, up to 1111).

Single level and MLC memory devices may be combined within the device 100. One of ordinary skill in the art will readily recognize that memory device 100 can include other parts, which are omitted from FIG. 1 to help focus on the various embodiments described herein. Memory device 100 may include one or more of the embodiments described below with reference to FIG. 2 through FIG. 9.

Figure 2:
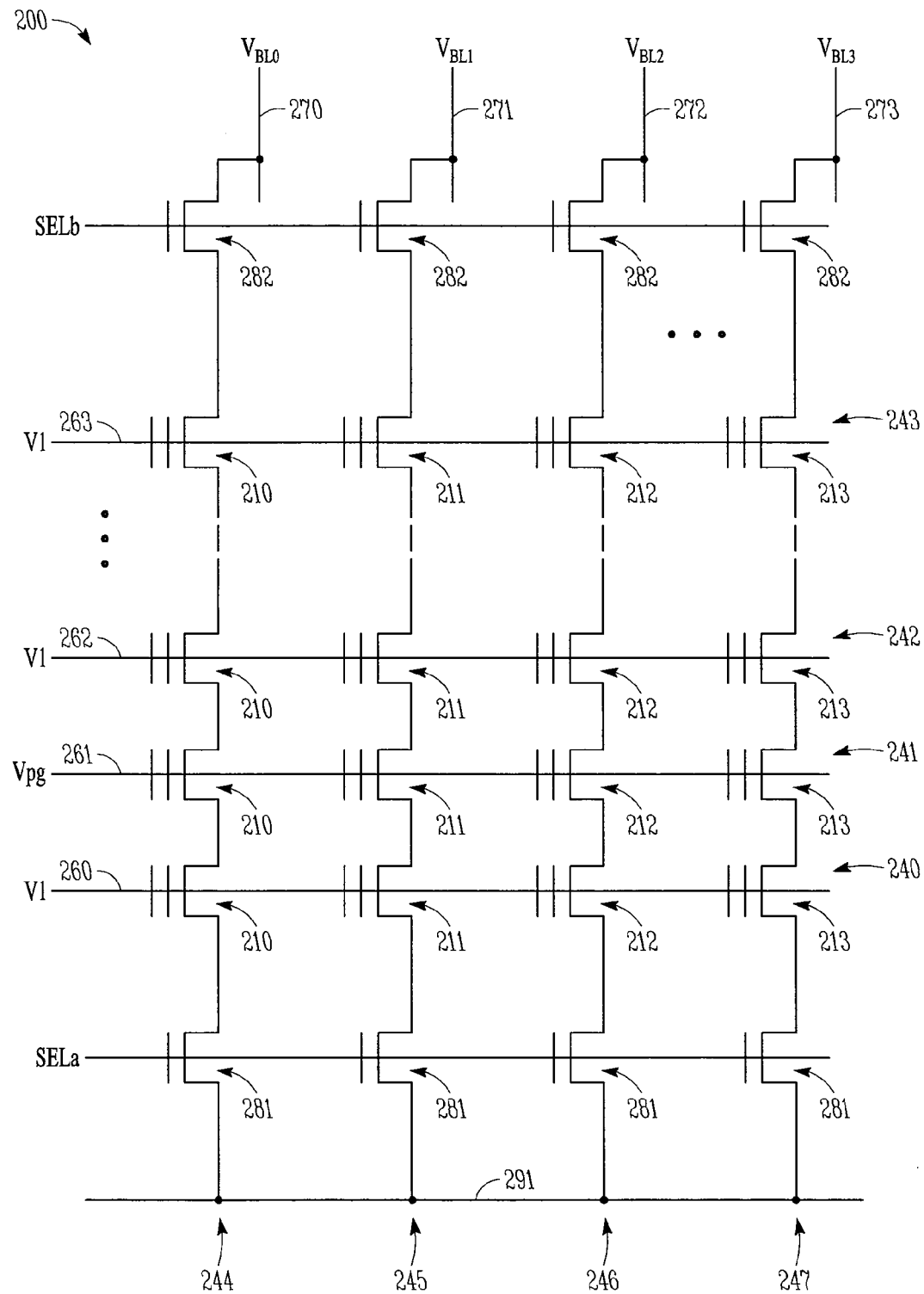
FIG. 2 shows a partial schematic diagram of a memory device, according to an embodiment of the invention.

FIG. 2 shows a partial schematic diagram of a memory device 200 according to an embodiment of the invention. Memory device 200 can be associated with memory device 100 of FIG. 1, such as forming a portion of memory array 102 of memory device 100. In FIG. 2, memory device 200 includes memory cells 210, 211, 212, and 213, arranged in rows 240, 241, 242, and 243, and columns 244, 245, 246, and 247. The memory cells in the same column may be connected in a series (sometimes called a string) of memory cells in their respective column, as illustrated in FIG. 2. FIG. 2 shows an example of four rows and four columns with four memory cells in each column. The number of rows, columns, and memory cells may vary.

As shown in FIG. 2, the memory cells in the same row (e.g., row 241) can be coupled to one of access lines 260, 261, 262, and 263. These access lines can correspond to portions of word lines of a memory device. Memory device 200 uses access lines 260, 261, 262, and 263 to access memory cells 210, 211, 212, and 213 during a read operation to read information stored in memory cells 210, 211, 212, and 213, and during a programming operation to store (e.g., program or write) information into memory cells 210, 211, 212, and 213. Memory device 200 uses lines 270, 271, 272, and 273 to transfer the information read from these memory cells during a read operation. Memory device 200 also include transistors 281 and 282 (responsive to signals SELa and SELb, respectively) to couple the memory cells in columns 244, 245, 246, and 247 to data lines 270, 271, 272, and 273, respectively. Data lines 270, 271, 272, and 273 may correspond to portions of bit lines of a memory device. Line 291 may correspond to a portion of a source (voltage) line of a memory device.

Memory device 200 stores information into memory cells 210, 211, 212, and 213 in a programming operation. The information stored in a particular memory cell (e.g., one of memory cells 210, 211, 212, and 213) is indicated by the threshold voltage value of that particular memory. For a multi-level-cell memory device, each memory cell can be programmed to have threshold voltage values to represent all possible combinations of multiple bits that can be stored in each memory cell. For example, when each of memory cells 210, 211, 212, and 213 corresponds to a 3-bit per cell, each of these memory cells can be programmed to have one of eight different threshold voltage values to represent a value corresponding to one of eight possible combinations of three binary bits of data (i.e., one of 000, 001, 010, 011, 100, 101, 110, and 111).

During a programming operation, memory device 200 may apply different voltages (e.g., voltages Vpg and V1) to access lines 260, 261, 262, and 263 to store information into selected memory cells among the memory cells of memory device 200. In the description herein, selected memory cells refer to the memory cells that are selected to store information in a particular programming operation, and unselected memory cells refer to the memory cells that are not selected to store information in that particular programming operation. The values (e.g., corresponding to a memory address) of the signals on terminals, such as terminals 110 and 111 of FIG. 1, can be used to determine which memory cells are selected to be programmed in a programming operation.

FIG. 2 shows an example where memory cells 210, 211, 212, and 213 in row 241 are selected memory cells to store information in a programming operation. The memory cells in rows 240, 242, and 243 are unselected memory cells. As shown in the example of FIG. 2, during a programming operation, memory device 200 applies voltage Vpg to access line 261 associated with the selected memory cells in row 241 and applies the same voltage V1 to other access lines 260, 262, and 263 associated with unselected memory cells in rows 240, 242, and 243. Memory device may also apply voltages $V_{BL0}$, $V_{BL1}$, $V_{BL2}$, and $V_{BL3}$ with different values to data lines 270, 271, 272, and 273, respectively.

In the example shown in FIG. 2, memory device 200 may use a substantially constant value for voltage V1 (e.g., approximately ten volts) to cause the unselected memory cells to operate as pass elements during a programming operation. Memory device 200 may use a value from approximately 15 volts to approximately 20 volts for voltage Vpg to program selected memory cells with threshold voltage values to represent information store therein.

Figure 3:
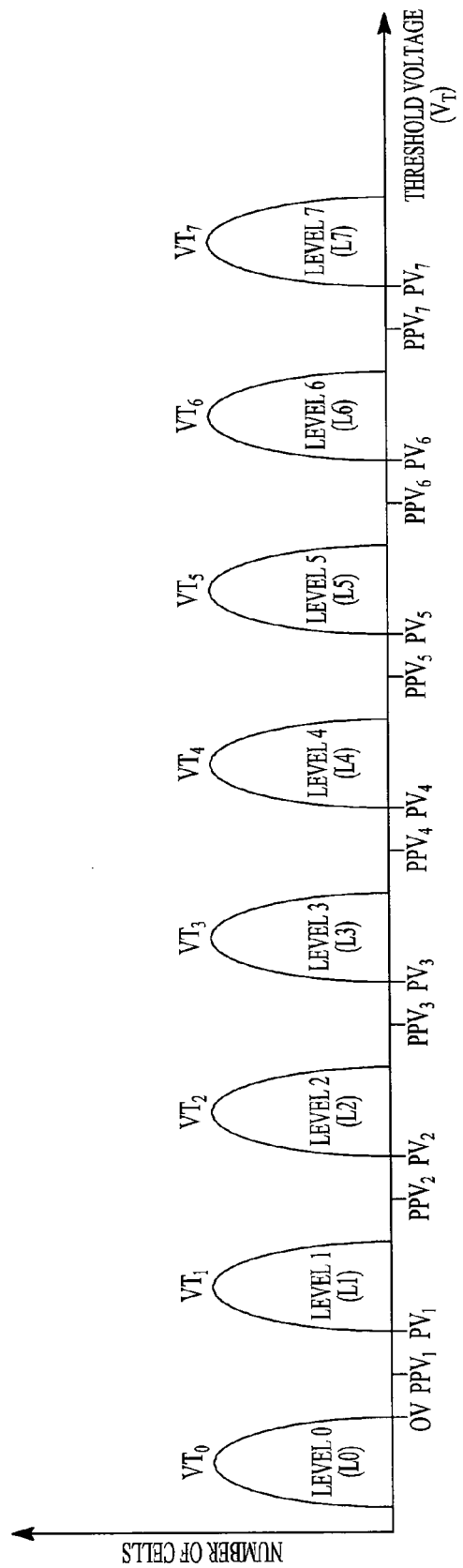
FIG. 3 shows an example of threshold voltage value ranges of the memory device of FIG. 2, according to an embodiment of the invention.

FIG. 3 shows an example of threshold voltage value ranges of memory device 200 of FIG. 2, according to an embodiment of the invention. As described above, memory device 200 can be a multi-level cell memory device. For example, memory device 200 can be a 3-bit per cell memory device. There are eight possible combinations of 3 bits. FIG. 3 shows eight levels (sometimes called states), level 0 (L0) through level 7 (L7) corresponding to eight different combinations of 3 bits. Each level has a corresponding voltage threshold value range of a threshold voltage for a large number of memory cells. For example, each of levels 0 through 7 has corresponding ranges for values of voltage threshold, labeled threshold voltage $VT_0$ through $VT_7$, respectively. As shown in FIG. 3, the threshold voltage value of threshold voltages $VT_0$ through $VT_7$ go from lowest threshold voltage (corresponding level 0) to highest threshold voltage value (corresponding to level 7). Thus, the threshold value of threshold voltage $VT_7$ is greatest among the threshold voltage values of threshold voltages $VT_0$ through $VT_7$.

Each level in FIG. 3 has associated verify voltages, such as pre-program verify voltage $PPV_i$ and program verify voltage $PV_i$, where index i corresponding to the level number. For example, level 6 has associated verify voltages $PPV_6$ and $PV_6$. Level 7 has associated verify voltages $PPV_7$ and $PV_7$. As shown in FIG. 3, each of verify voltages $PPV_i$ and $PV_i$ of a particular level is greater than the threshold voltage value of all lower levels. For example, each of $PPV_7$ and $PV_7$ of level 7 is greater than the threshold voltage value of threshold voltage $VT_6$ corresponding to level 6 and lower levels.

Memory device 200 can use verify voltages $PPV_i$ and $PV_i$ during a verify operation within the programming operation to determine whether a memory cell being programmed has reached its target threshold voltage value during the programming operation. A verify operation can include sensing the memory cell and comparing its threshold voltage value with verify voltages $PPV_i$ and $PV_i$. A memory cell has reached its target threshold voltage value if its threshold voltage value exceeds its associated verify voltage $PV_i$. If the memory cell has not reached its target threshold voltage value, then the programmed operation and verify operation are repeated until the threshold voltage value of the memory cell exceeds its associated verify voltage $PV_i$. Each time the programming operation repeats programming a memory cell, the value of the voltage (e.g., Vpg in FIG. 2) associated with the memory cell being programmed can be increased. Each time the programming operation repeats programming a memory cell, the value of the voltage on the data line (e.g., $V_{BL0}$, $V_{BL1}$, $V_{BL2}$, or $V_{BL3}$ in FIG. 2) associated with the memory cell being programmed can remain the same or can be changed (increased or decreased), based on the threshold voltage value of the memory cell, as explained in more detail with reference to FIG. 4 through FIG. 9.

In FIG. 3, for example, if a particular memory cell is to be programmed to have a threshold voltage value corresponding to level 6, then during a programming operation, memory device 200 can perform a verify operation to compare the threshold voltage of that particular memory cell with verify voltages $PPV_6$ and $PV_6$. In this example, the particular memory cell has reached its target threshold voltage value if the threshold voltage of that particular memory cell during the programming operation exceeds verify voltage $PV_6$. If the threshold voltage of that particular memory cell during the programming operation does not exceed verify voltage $PV_6$ during the verify operation, meaning that the particular memory cell has not reached its target threshold voltage value, then the programming operation and verify operation are repeated until the threshold voltage value of that memory cell exceeds its associated verify voltage $PV_6$.

Figure 4:
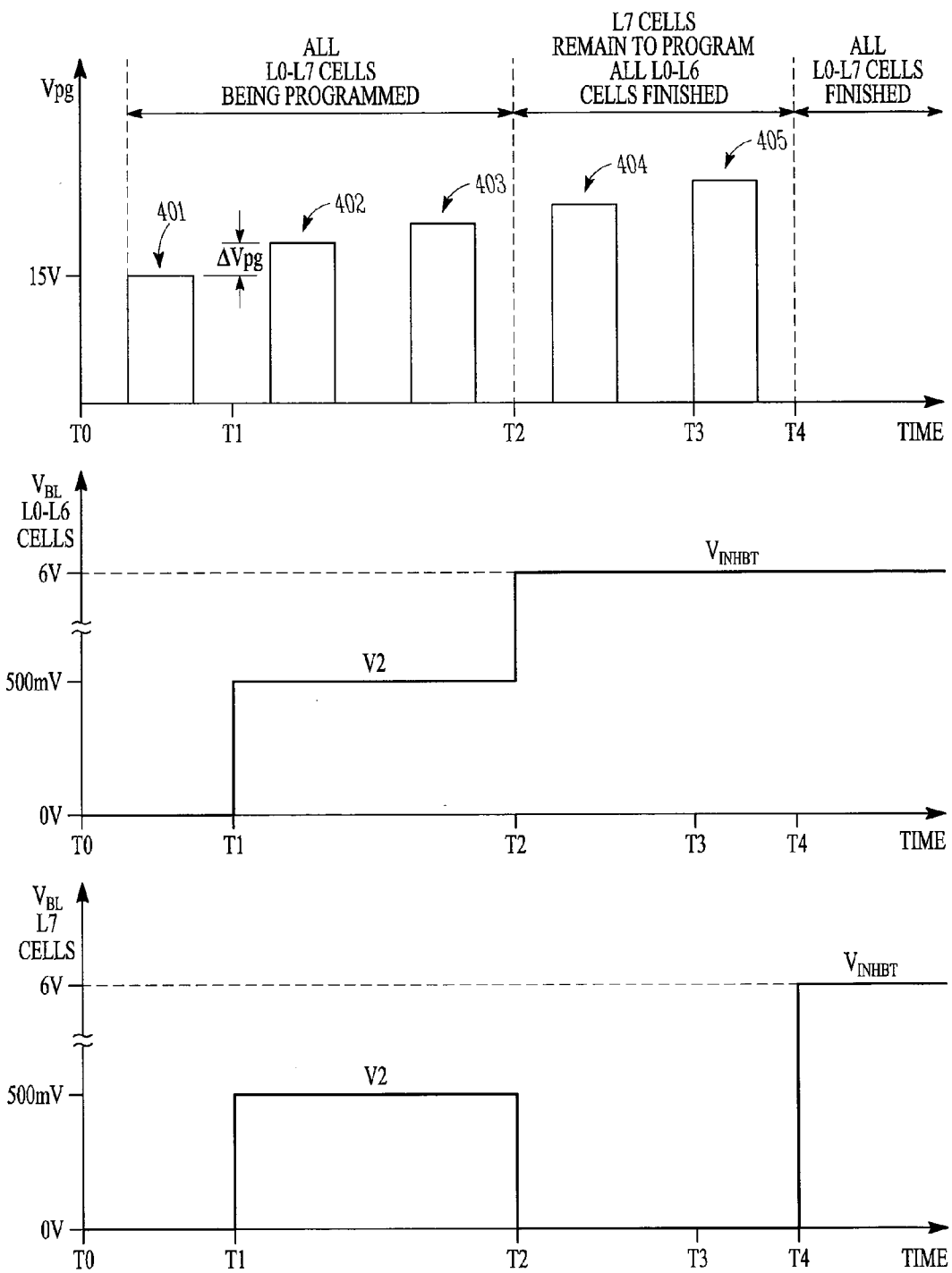
FIG. 4 shows graphs indicating values of a voltage at an access line and voltages at data lines of the memory device of FIG. 2 during a programming operation, according to an embodiment of the invention.

FIG. 4 show graphs indicating values of voltage Vpg at access line 261 and voltage $V_{BL}$ at data lines 270 through 273 of memory device 200 of FIG. 2 during a programming operation, according to an embodiment of the invention. In FIG. 4, voltage $V_{BL}$ for L0-L6 cells (middle graphs) represents one or more of voltages $V_{BL0}$ through $V_{BL3}$ at data lines 270 through 273 associated with the group of memory cells that are to be programmed to have threshold voltage values corresponding to level 0 (L0) through level 6 (L6). Voltage $V_{BL}$ for L7 cells (bottom graph) represents one or more of voltages $V_{BL0}$ through $V_{BL3}$ at data lines 270 through 273 associated with the group of memory cells that are to be programmed to have threshold voltage values corresponding to level 7.

As shown in FIG. 4, voltage Vpg includes a number of programming pulses 401 through 405 between times T0 and T4. FIG. 4 shows an example of five programming pulses. The number of programming pulses may vary in each of the time intervals T1-T2, T2-T3, and T3-T4. Voltage Vpg may have an initial value of approximately 15 volts, as represented by magnitude of programming pulse 401 being approximately 15 volts. Voltage Vpg can be successively increased by an amount, such as by delta (Δ) Vpg, from one programming pulse to the next programming pulse. The value of ΔVpg can be the same or different between two different programming pulses. In FIG. 4, the value of ΔVpg can be approximately 500 millivolts, though other values may be used. FIG. 4 shows an example of memory device 200 being a 3-bit per cell memory device, such that each memory cell can be programmed to have a threshold voltage value corresponding to one of eight levels L0 through L7, as illustrated in FIG. 3.

In the same programming operation to program memory cells of the same row, the memory cells of that same row can be grouped into two groups, one group includes memory cells that are to be programmed to have threshold voltage values corresponding to level 0 (L0) through level 6 (L6), and the other group includes memory cells that are to be programmed to have threshold voltage values corresponding level 7 (L7). A group of memory cells can include either multiple memory cells or only one memory cell. In FIG. 4, and the description herein, "L0-L6 cells" refers to a group of memory cells in the same row that are to be programmed to have threshold voltage values corresponding to level 0 (L0) through level 6 (L6). "L7 cells" refers to a group of memory cells in the same row as the L0-L6 cells that are to be programmed to have threshold voltage values corresponding to level 7 (L7) during the same programming operation as the L0-L6 cells.

FIG. 4 shows L0-L6 cells and L7 cells in an example where memory device 200 is a 3-bit per cell memory device. However, if memory device 200 has a different number of bits per cell, then L0-L6 and L7 in FIG. 4 can be replaced with other appropriate levels. For example, for a 2-bit per cell (four possible levels L0-L3), L0-L2 could replace L0-L6 and L3 could replace L7. In another example, in a 4-bit per cell (sixteen possible levels L0-L15), L0-L14 could replace L0-L6 and L15 could replace L7. Thus, L7 in FIG. 4 represents the last level corresponding to a highest threshold voltage value that can be programmed into a multi-level cell.

In the same programming operation, all L0-L7 cells in the same row are programmed substantially concurrently (e.g., at each programming pulse) to various levels corresponding to their target threshold voltage values. Among the L0-L7 cells, some cells can be fast cells and other cells can be slow cells. Fast cells refer to cells that can reach their target threshold voltage values faster than other cells even if the fast cells may be programmed to have target threshold voltage values that are equal to or higher than the target threshold voltage values of the other cells. In the opposite, slow cells refer to cells that reach their target threshold voltage values slower than other cells even if the slow cells may be programmed to have target threshold voltage values that are equal to or lower than the target threshold voltage values of the other cells. Thus, in some situations, in the same row of memory cells, programming of some memory cells (e.g., fast cells) to a particular level (e.g., L6) can be finished before programming of some other cells (e.g., slow cells) to that same particular level (e.g., L6) is finished. In other situations, programming of some fast cells to a higher level (e.g., L7) can be finished before programming of some slow cells to a lower level (e.g., L6) is finished.

Memory device 200 of FIG. 2 may set the values of voltage $V_{BL}$ for L0-L6 cells and the values of voltage $V_{BL}$ for L7 cells in different fashions, as described in detail below.

As shown in FIG. 4, between times T0 and T1, voltages $V_{BL}$ for L0-L6 cells and L7 cells can be at an initial value, for example, zero volts (e.g., ground potential) when programming pulse 401 is applied to access line 261 (FIG. 2) to program memory cells 210 through 213 in row 241. During a programming operation, the threshold voltage values of L0-L7 cells are changed (e.g., increased) after each application of programming pulses 401 through 405 and move towards their target threshold voltage values. Between times T1 and T2 one or more programming pulses 402 and 403 can be applied to access line 261 of FIG. 2 to continue to program L0-L7 cells.

Between times T1 and T2, programming of L0-L7 cells is treated in the same way. If a threshold voltage $VT_i$ of any cell among the L0-L7 cells is greater than its respective verify voltage $PPV_i$ but less than its respective verify voltage $PV_i$ (i.e., $PPV_i < VT_i < PV_i$), then voltage $V_{BL}$ for that cell (among L0-L7 cells) can be increased from zero volts to an intermediate voltage V2 between times T1 and T2. FIG. 4 shows an intermediate voltage V2 of approximately 500 millivolts (mV). Other positive values for intermediate voltage V2 can be used.

Different cells may be programmed to have different threshold voltage values. Thus, the threshold voltage values of different cells may exceed their respective verify voltages $PPV_i$ at different times during programming. For example, as shown in FIG. 4 if memory cell 210 in row 241 of FIG. 2 is to be programmed to have a threshold voltage value associated with level 1, and if $PPV_1 < VT_1 < PV_1$ happens in memory cell 210 (e.g., at time T1), then $V_{BL0}$ at data line 270 associated with memory cell 210 can be increased from zero volts to intermediate voltage V2 (e.g., at time T1).

In another example, if memory cell 212 in row 242 of FIG. 2 is to be programmed to have a threshold voltage value associated with level 6, and if $PPV_6 < VT_6 < PV_6$ happens in memory cell 212 at a particular time between times T1 and T2, then $V_{BL2}$ at data line 272 associated with memory cell 212 can be increased from zero volts to intermediate voltage V2 at that particular time (between times T1 and T2).

In a further example, if memory cell 211 in row 242 of FIG. 2 is to be programmed to have a threshold voltage value associated with level 7, and if $PPV_7 < VT_C < PV_7$ happens in memory cell 211 at a particular time between times T1 and T2, then $V_{BL1}$ at data line 271 associated with memory cell 211 can be increased from zero volts to intermediate voltage V2 at that particular time (between times T1 and T2). In this example, memory cell 211 can be a fast cell. Therefore, the threshold voltage $VT_7$ of memory cell 211 between times T1 and T2 may exceed $PPV_7$ ($VT_7 > PPV$) while programming of L0-L6 cells is not finished because some of the L0-L6 cells can include slow cells. In FIG. 4, $V_{BL} = V2 = 500$ mV between times T1 and T2 does not indicate that 500 mV is always applied to a data line of an L7 between times T1 and T2. It indicates that if an L7 cell has $PPV_7 < VT_C < PV_7$ at any particular time between times T1 and T2, then voltage $V_{BL}$ at the data line associated with that cell can be applied with V2=500 mV at that particular time. If an L7 cell does not have $PPV_7 < VT_C < PV_7$ between times T1 and T2, then voltage $V_{BL}$ at the associated data line of that cell can remain at zero volts between times T1 and T2.

A voltage $V_{INHBT}$ can be applied to a data line associated with a memory cell if that memory cell has reached its target threshold voltage value, to prevent further programming of that cell. FIG. 4 shows an example of $V_{INHBT}$ being approximately 6 volts. Other positive values (e.g., supply voltage Vcc of memory device 200) for voltage $V_{INHBT}$ can be used. During a programming operation, different memory cells in the same row may be programmed to have different threshold voltage values associated with different levels 1 through level 6. Thus, L0-L6 cells may reach may reach their target threshold voltage values at different time between times T1 and T2. Accordingly, voltage $V_{INHBT}$ can be applied to different data lines associated with different L0-L6 cells at different times between times T1 and T2. For simplicity, FIG. 4 does not show voltage $V_{INHBT}$ being applied to the data line associated with L0-L6 cells that are finished between times T1 and T2. Applying voltage $V_{INHBT}$ to a data line associated with a memory cell also indicates that programming of that memory cell is finished. FIG. 4 shows an example where programming of all L0-L6 cells is finished at time T2.

Between times T2 and T4, only memory cells remaining to be programmed are L7 cells. At the time that all L0-L6 cells are finished (e.g., at time T2), most of the L7 cells may also be finished ($VT_7 > PV_7$). A significant number of L7 cells may have $VT_7$ greater than $PPV_7$ but less than $PV_7$ ($PPV < VT_7 < PV_7$), and some slow L7 cells may have $VT_7$ being less than $PPV_7$ ($VT_7 < PPV_7$). Similarly to L0-L6 cells, voltage $V_{INHBT}$ can be applied to the data line associated with the finished L7 cells that have $VT_7$ greater than $PV_7$. However, for simplicity, FIG. 4 does not show voltage $V_{INHBT}$ being applied to the data line associated with L7 cells that are finished between times T1 and T2. FIG. 4 shows voltage $V_{BL}$ of approximately 500 millivolts (V2) being applied to data lines associated with only L7 cells having $PPV_7 < VT_7 < PV_7$. For slow L7 cells having $VT_7 < PPV_7$ at the time that all L0-L6 cells are finished, voltage $V_{BL}$ at data lines associated with these cells can remain at zero volts (not shown in FIG. 4).

As shown in FIG. 4 between times T2 and T3, for L7 cells having $PPV_7 < VT_7 < PV_7$, voltage $V_{BL}$ for these L7 cells can be decreased from intermediate voltage V2 to zero volts. For L7 cells that are finished, voltage $V_{BL}$ for these cells can remain at voltage $V_{INHBT}$ (not shown in FIG. 4). For slow L7 cells (unfinished) that having $VT_7 < PPV_7$, voltage $V_{BL}$ for these cells can remain at zero volts. One or more programming pulses 404 and 405 can be used to program L7 cells between times T2 and T3 until all L7 cells reach their target threshold voltage values. For example, at time T4, all L7 cells have reached their target threshold voltage values. Therefore, further programming of L7 cells is not needed. FIG. 4 shows voltage $V_{INHBT}$ applied to data lines associated with all L7 cells at time T4, indicating that programming of all L7 cells is finished. After time T4, the programming operation of a row is finished and memory device 200 can exit the programming operation or may continue to program another row.

Figure 5:
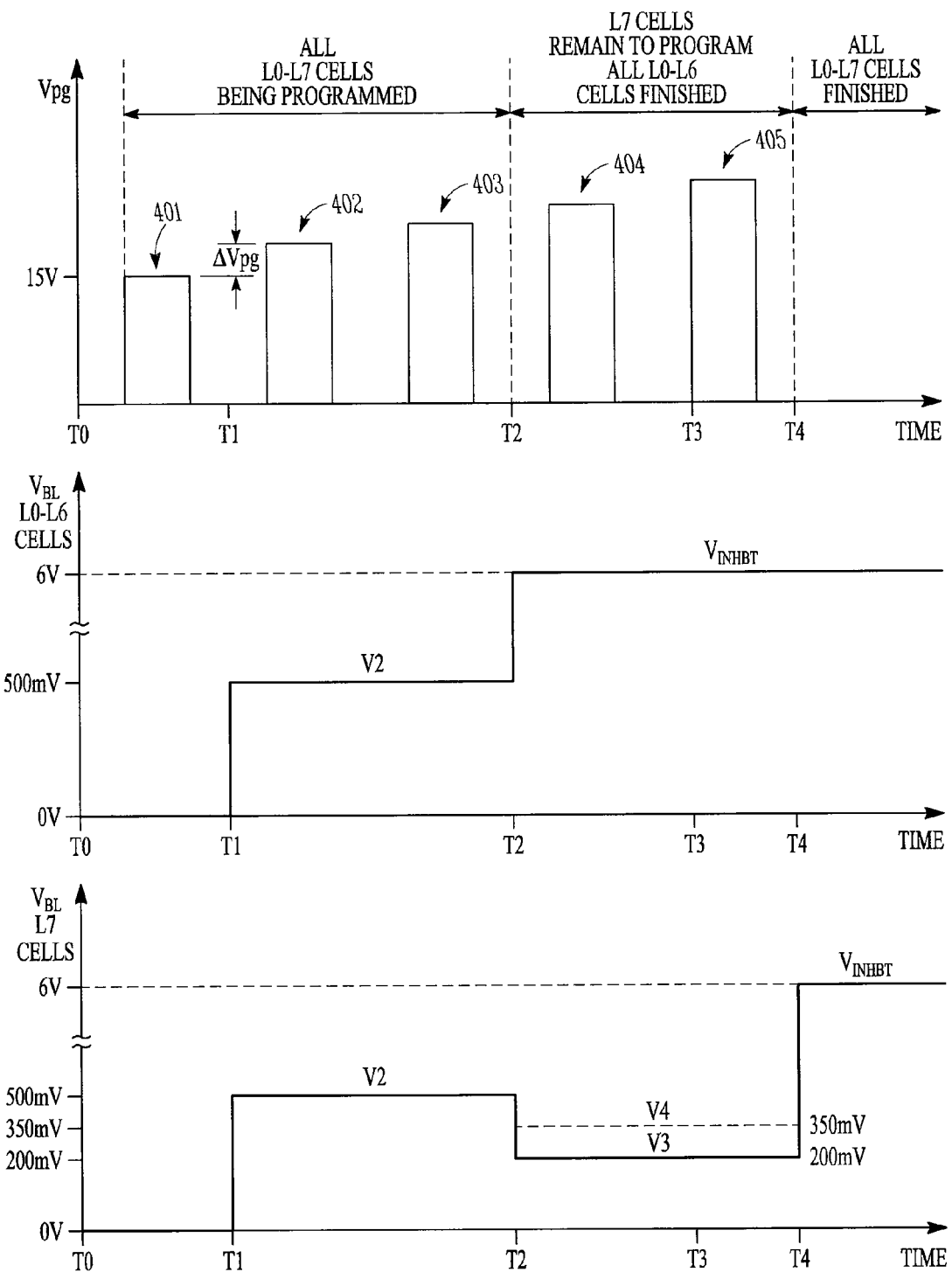
FIG. 5 shows graphs indicating values of a voltage at an access line and voltages at data lines of the memory device of FIG. 2 during a programming operation, according to an alternative embodiment of the invention.

FIG. 5 are graphs showing values of voltage Vpg at access line 261 and voltage $V_{BL}$ at data lines 270 through 273 of memory device 200 of FIG. 2 during a programming operation, according to an alternative embodiment of the invention. The graphs in FIG. 5 are the same as those in FIG. 4 except for the value of voltage $V_{BL}$ for L7 cells between times T2 and T4. In FIG. 5, the value of voltage $V_{BL}$ for L7 cells having $PPV_7 < VT_7 < PV_7$ can be decreased from intermediate voltage V2 to either voltage V3 or V4, which are greater than zero volts. In FIG. 4, the value of voltage $V_{BL}$ for L7 cells can be decreased from intermediate voltage V2 to zero volts.

Voltage V3 in FIG. 5 has an example value of approximately 200 millivolts. Voltage V4 has an example value of approximately 350 millivolts. Other positive values for voltages V3 and V4 that are less than intermediate voltage V2 and greater than zero can be used. The value of voltage $V_{BL}$ for L7 having $PPV_7 < VT_7 < PV_7$ cells can be decreased from intermediate voltage V2 to voltage V3 if threshold voltage values of all L7 cells remaining to be programmed are greater than a verify voltage value (e.g., PPV) associated with L7 cells. The value of voltage $V_{BL}$ for L7 cells having $PPV_7 < VT_7 < PV_7$ can be decreased from intermediate voltage V2 to voltage V4 if a threshold voltage value of any L7 cell remaining to be programmed is less than the verify voltage value (e.g., PPV) associated with L7 cells.

Thus, during a programming operation, after memory device 200 is finished with the programming of L0-L6 cells, it can decrease the value of voltage $V_{BL}$ at data lines associated with L7 cells (L7 cells having $PPV_7 < VT_7 < PV_7$) from intermediate voltage V2 to zero volts in one embodiment (e.g., FIG. 4), or to a positive voltage value (e.g., V3 or V4) in another embodiment (e.g., FIG. 5). Decreasing the value of voltage $V_{BL}$ at data lines associated with L7 cells from intermediate voltage V2 to voltage V3 or V4 (instead of zero volts) may allow the threshold voltage value range of L7 cells to be narrower. Thus, reading of L7 cells may be more accurate.

Figure 6:
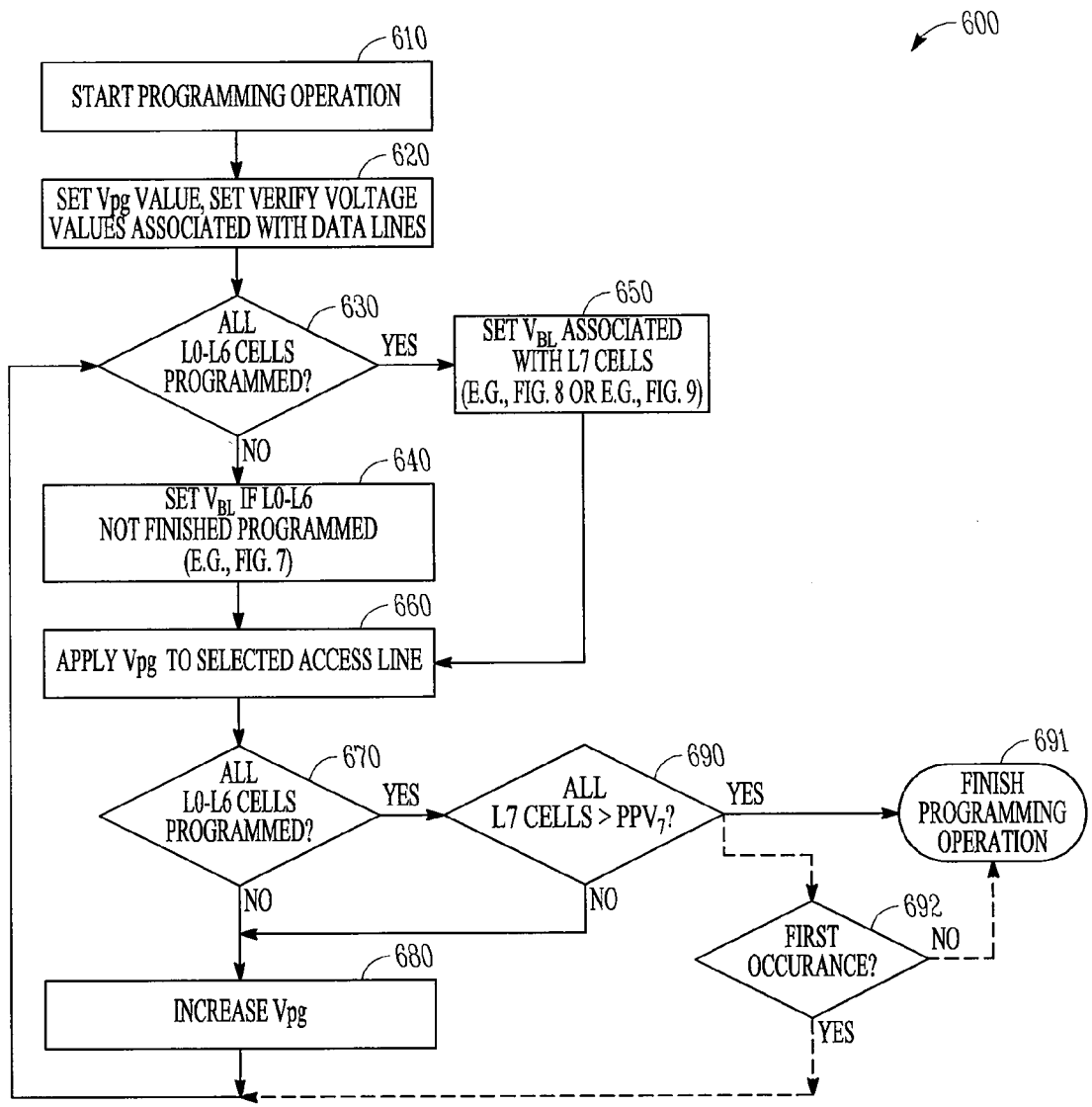
FIG. 6 shows a flow diagram for a method of programming a memory device, according to an embodiment of the invention.

FIG. 6 is a flow diagram showing a method 600 of programming a memory device, according to an embodiment of the invention. The memory device used in method 600 can include memory devices 100 and 200 of FIG. 1 and FIG. 2.

Activity 610 of method 600 includes starting to perform a programming operation when the memory device receives a write command. The write command may be received from an external device such as a processor.

Activity 620 of methods 600 includes setting a value of voltage Vpg, which is applied to an access line associated with memory cells to be programmed. For example, activity 620 may set the value of voltage Vpg at approximately 15 volts. Activity 620 may also include setting values of verify voltages for particular data lines based on information (e.g., provided by a user) to be programmed into the memory cells associated with those particular data lines. The values of the verify voltages used in method 600 can be similar to verify voltages $PPV_i$ and $PV_i$ associate with each level of FIG. 4, where i corresponds to the level number. For example, in activity 620, if a memory cell associated with a particular data line is to be programmed to have a threshold voltage value corresponding to level 3 (L3), then activity 620 may set appropriate values of the verify voltages (e.g., $PPV_3$ and $PV_3$) associated with that particular data line. During programming, the threshold voltage value of the memory cell is compared with the values of these verify voltages to determine whether the threshold voltage value of the memory cell being programmed reaches a target threshold voltage value. Since different memory cells associated with the same access line may be programmed to have different threshold voltage values, activity 620 may set different values of verify voltages for different data lines.

For ease of describing method 600, the memory device used in method 600 is assumed to be a 3-bit per cell. Thus, each memory cell of the memory device used in method 600 can be programmed to have a threshold voltage value corresponding to one of eight levels (L0 through L7), with L7 being the level associated with the highest values, that is, the last level corresponding to a highest threshold voltage value that can be programmed into a multi-level cell of the memory device. If the memory device used in a system has a different number of bits per cell, then L0-L6 and L7 in FIG. 6 can be replaced with other appropriate levels, as previously discussed.

Activity 630 of methods 500 includes determining whether L0-L6 cells have reached their target threshold voltage values. For example, activity 630 compares the threshold voltage values of L0-L6 cells with their respective verify values that are previously set in activity 620.

If the threshold voltage values of all L0-L6 cells have not exceeded their respective verify values (e.g., PV values), then method 600 determines that at least one of the L0-L6 cells has not yet reached its target threshold voltage value and continues with activity 640. If the threshold voltage values of all L0-L6 cells exceed their respective verify voltage values (e.g., PV values), then method 600 determines that all L0-L6 have reached their target threshold voltage values and continues with activity 650.

The memory device used in method 60 may include a storage unit, such as storage unit 120 of memory device 100 of FIG. 1. During a programming operation, the storage unit of the memory device may store programming information, such as information indicating whether the threshold voltage values of all L0-L6 cells have reached their respective target threshold voltage values, meaning that the threshold voltage values of all L0-L6 cells exceed their respective verify voltage values, such as PV value.

Figure 7:
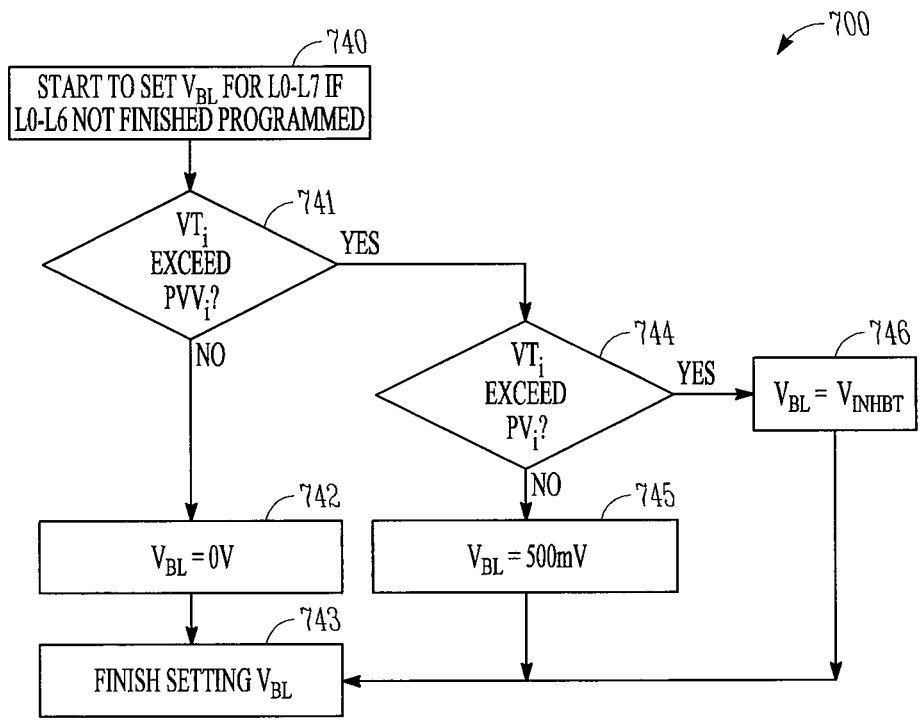
FIG. 7 shows a method of setting voltages at data lines associated with all memory cells being programmed before a group of the memory cells have been programmed, according to an embodiment of the invention.

Activity 640 includes setting a value of a voltage $V_{BL}$ at data lines associated with L0-L7 cells when at least one of the L0-L6 cells has not reached its target threshold voltage value. FIG. 7 (described below) shows a method to perform activity 640 of FIG. 6.

Figure 8:
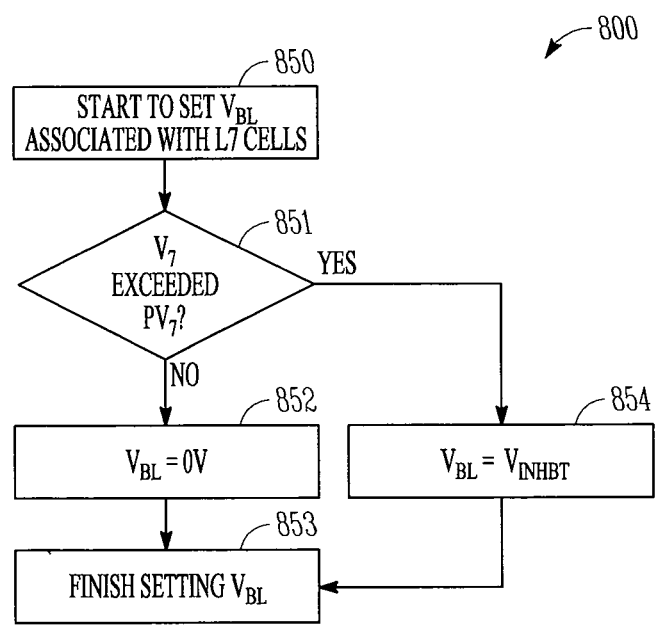
FIG. 8 shows a method of setting voltages at data lines associated with a group of memory cells being programmed after another group of the memory cells have been programmed, according to an embodiment of the invention.
Figure 9:
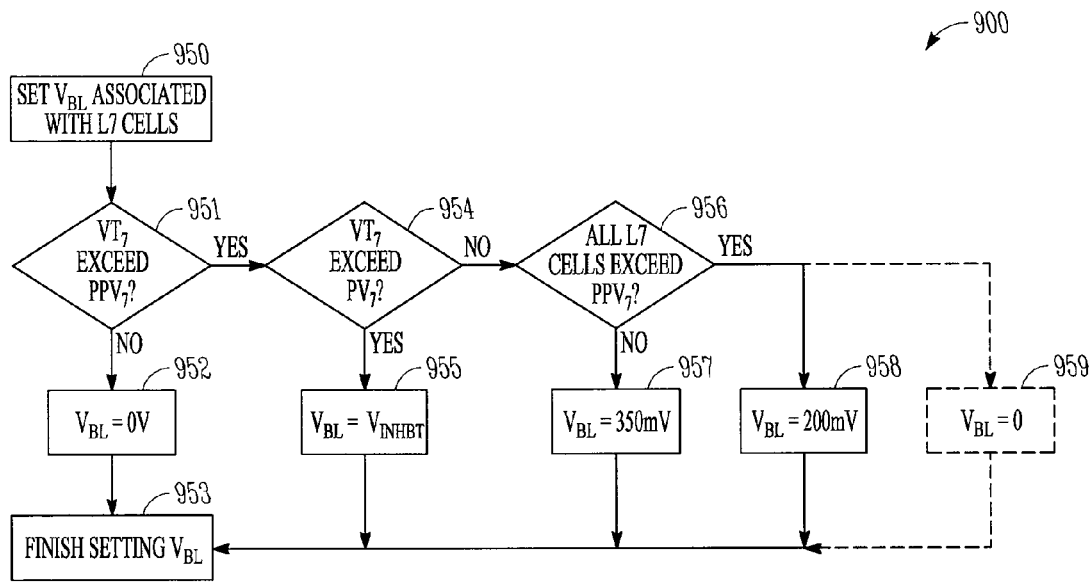
FIG. 9 shows an alternative method of setting voltages at data lines associated with a group of memory cells being programmed after another group of the memory cells have been programmed, according to an embodiment of the invention.

Activity 650 includes setting a value of a voltage $V_{BL}$ at data lines associated with L7 cells when all the L0-L6 cells have reached their target threshold voltage values. FIG. 8 and FIG. 9 (described below) show two different methods to perform activity 650 of FIG. 6.

In FIG. 6, method 600 continues with activity 660 after either activity 640 or activity 650. Activity 660 includes applying voltage Vpg to the selected access line, which is the access line associated with the memory cells being programmed. Voltage Vpg may include a number of programming pulses with different magnitude values.

Activity 670, which is similar to activity 630, includes determining whether L0-L6 cells have reached their target threshold voltage values. If at least one of the L0-L6 cells has not reached its target threshold voltage value, method 600 continues with activity 680 to increase the value of voltage Vpg (increase Vpg by 500 millivolts, for example) and repeats activity 630, activity 640, activity 660, and activity 670. If all L0-L6 cells have reached their target threshold voltage values by the determination in activity 670, method 600 continues with activity 690.

Activity 690 includes determining whether the threshold voltage values of all L7 cells exceed verify voltage $PPV_7$, which is the same as determining whether a threshold voltage value of at least one of the L7 cells is not greater than verify voltage $PPV_7$. If the threshold voltage values of all L7 cells do not exceed verify voltage $PPV_7$, method 600 continues with activity 680 to increase the value of voltage Vpg and goes back to activity 630. If the threshold voltage values of all L7 cells exceed verify voltage $PPV_7$, then method 600 continues with activity 691 and finishes the programming operation.

During a programming operation, the storage unit of the memory device may store information indicating whether the threshold voltage values of all L7 cells exceed verify voltage $PPV_7$ (which is greater than target threshold voltage values of all L0-L6 cells).

Alternatively, method 600 may include an additional activity 692, which includes determining whether it is a first occurrence that the threshold voltage values of all L7 cells exceed verify voltage $PPV_7$. If it is not a first occurrence (e.g., second occurrence that the threshold voltage values of all L7 cells exceed verify voltage $PPV_7$), then method 600 may continue with activity 691 and finish the programming operation without applying any additional programming pulse of voltage Vpg to an access line associated with L0-L7 cells. If it is a first occurrence that the threshold voltage values of all L7 cells exceed verify voltage $PPV_7$, then method 600 may repeat activity 630, activity 650, activity 670, activity 690, and activity 692 and apply only one additional programming pulse of voltage Vpg to an access line associated with L0-L7 cells and continue to activity 691 to finish the programming operation. Alternatively, instead of applying only one additional programming pulse of voltage Vpg to finish the programming operation, more than one additional programming pulse can be applied to finish the programming operation.

In the above description, since all L7 cells exceed verify voltage $PPV_7$, applying only one additional programming may be enough to allow all L7 cells to be within the range for values of voltage threshold corresponding to level 7. In some situations, only one additional programming may not be enough to allow all L7 cells to be within the range for values of voltage threshold corresponding to level 7. In these situations, the range can be slightly wider. The wider range in these situations can be acceptable because level 7 is the last level in a 3-bit per cell memory (e.g., as shown in FIG. 3) in which there is no other level above level 7 that needs to be differentiate from this last level.

In the above description, applying more than one additional programming pulse after L7 cells exceed verify voltage $PPV_7$ may result in a between (e.g., tighter) range for values of voltage threshold corresponding to level 7. However, more than one additional programming pulse may disturb other cells (e.g., finished cells), resulting in a potential degradation or destruction of data in other cells.

FIG. 7 shows a method 700 of setting voltage $V_{BL}$ at L0-L7 cells before all L0-L6 cells have been programmed, according to an embodiment of the invention. Method 700 can be used to perform activity 640 of method 600 of FIG. 6. Method 700 includes activity 740 to start setting value of voltage $V_{BL}$ at data lines associated with L0-L7 cells when at least one of the L0-L6 cells has not yet reached its target threshold voltage value. Method 700 may use the same activities in FIG. 7 to set each data line associated with L0-L7 cells with different values of voltage $V_{BL}$. The value of voltage $V_{BL}$ at a particular data line is based on the threshold voltage value of the memory cell associated with that particular data line at the time method 700 sets the value of voltage $V_{BL}$. In FIG. 7, $VT_i$, $PPV_i$, and $PV_i$ refer to the threshold voltage and the verify voltages, respectively, of a particular memory cell. For example, if a particular memory cell is to be programmed to have a threshold voltage value corresponding to level 5, then $VT_i$, $PPV_i$, and $PV_i$ in FIG. 7 refer to $VT_5$, $PPV_5$, and $PV_5$. If a particular memory cell is to be programmed to have a threshold voltage value corresponding to level 7, then $VT_i$, $PPV_i$, and $PV_i$ in FIG. 7 refer to $VT_7$, $PPV_7$, and $PV_7$.

Activity 741 of method 700 includes determining whether the threshold voltage value of threshold voltage $VT_i$ of a particular memory cell exceeds the value of its associated verify voltage $PPV_i$.

If the threshold voltage value of $VT_i$ in activity 741 does not exceed the value of its associated verify voltage $PPV_i$, then activity 742 sets the voltage of $V_{BL}$ at the associated data line to zero volts. Method 700 continues with activity 743 to finish setting of voltage $V_{BL}$ and return to activity 660 of FIG. 6.

If the threshold voltage value of $VT_i$ in activity 741 exceeds the value of its associated verify voltage $PPV_i$, then activity 744 determines whether the threshold voltage value of $VT_i$ of a particular memory cell exceeds the value of its associated verify voltage $PV_i$.

If the threshold voltage value of $VT_i$ in activity 744 does not exceed the value of its associated verify voltage $PV_i$, then activity 745 sets the voltage of $V_{BL}$ at the associated data line to an intermediate voltage, for example, approximately 500 millivolts. Method 700 continues with activity 743 to finish setting of voltage $V_{BL}$ and return to activity 660 of FIG. 6.

If the threshold voltage value of $VT_i$ in activity 744 exceeds the value of its associated verify voltage $PV_i$, then activity 746 sets the voltage of $V_{BL}$ at the associated data line to a voltage $V_{INHBT}$. The value of voltage $V_{INHBT}$ can be approximately 6 volts. Method 700 continues with activity 743 to finish setting of voltage $V_{BL}$ and return to activity 660 of FIG. 6.

FIG. 8 shows a method 800 of setting voltage $V_{BL}$ at L7 cells after all L0-L6 cells have been programmed, according to an embodiment of the invention. Method 800 can be used to perform activity 650 of method 600 of FIG. 6. Method 800 includes activity 850 to start setting a value of voltage $V_{BL}$ at data lines associated with only L7 cells after all L0-L6 cells to be programmed in a single programming in a row have reached their target threshold voltage values. $VT_7$ and $PV_7$ in FIG. 8 refer to the threshold voltage and the verify voltage, respectively, of L7 cells that have not been programmed to their target threshold voltage values. As described above with reference to FIG. 4, most of the L7 cells may already be finished ($VT_7 > PV_7$) at a time that all L0-L6 cells are finished. Method 800 of FIG. 8 describes setting voltage $V_{BL}$ at one data line associated with one memory cell among the L7 cells that are unfinished. Voltage $V_{BL}$ at each data line associated with a memory cell among all unfinished L7 cells can be set in the same fashion. Unfinished L7 cells may include L7 cells having $PPV_7 < VT_7 < PV_7$ and/or L7 cells having $VT_7 < PV_7$.

Activity 851 of method 800 includes determining whether the threshold voltage value of threshold voltage $VT_7$ of a particular memory cell (among L7 cells) exceeds the value of its associated verify voltage $PV_7$.

If the threshold voltage value of $VT_7$ in activity 851 does not exceed the value of its associated verify voltage $PV_7$, then activity 852 sets the voltage of $V_{BL}$ at the associated data line to zero volts. Method 800 continues with activity 853 to finish setting of voltage $V_{BL}$ and return to activity 660 of FIG. 6.

If the threshold voltage value of $VT_7$ in activity 851 exceeds the value of its associated verify voltage $PV_7$, then activity 854 sets the value of voltage $V_{BL}$ at the associated data line to a voltage $V_{INHBT}$. Method 800 continues with activity 843 to finish setting of voltage $V_{BL}$ of that particular data line.

Method 800 may return to activity 660 of FIG. 6 after it finishes setting data lines associated with all L7 cells.

Thus, when all L0-L6 cells have reached their target threshold voltage values, method 800 may set the voltage of $V_{BL}$ at a data line associated with a memory cell among the L7 cells to either zero volts or a voltage $V_{INHBT}$, based on a comparison of threshold voltage value of $VT_7$ with its associated verify voltage $PV_7$.

At the start of method 800, such as at activity 850, the data line associated with a particular memory cells among the L7 cells may have an intermediate voltage (e.g., 500 millivolts) applied to it by activity 745 of method 700 in FIG. 7, before the L0-L6 cells reach their target threshold voltage values. Thus, in FIG. 8, when method 800 sets the value of $V_{BL}$ at a data line to zero volts, method 800 may decrease the value of voltage $V_{BL}$ at a data line from 500 millivolts to zero volts.

FIG. 9 shows an alternative method 900 of setting voltage $V_{BL}$ at L7 cells after L0-L6 cells have been programmed, according to an embodiment of the invention. Method 900 can be used to perform activity 650 of method 600 of FIG. 6. Method 900 includes activity 950 to start setting value of voltage $V_{BL}$ at data lines associated with only L7 cells after all L0-L6 cells have reached their target threshold voltage values. $VT_7$, $PPV_7$, and $PV_7$ in FIG. 9 refer to the threshold voltage and the verify voltages, respectively, of L7 cells that have not been programmed to their target threshold voltage values. The following description describes method 900 setting voltage $V_{BL}$ at one data line associated with one memory cell among the L7 cells that are unfinished. Voltage $V_{BL}$ at each data line associated with a memory cell among the unfinished L7 cells can be set in the same fashion. As described above, unfinished L7 cells may include L7 cells having $PPV_7 < VT_7 < PV_7$ and/or L7 cells having $VT_7 < PV_7$.

Activity 951 of method 900 includes determining whether the threshold voltage value of threshold voltage $VT_7$ of a particular memory cell (among L7 cells) exceeds the value of its associated verify voltage $PPV_7$.

If the threshold voltage value of $VT_7$ in activity 951 does not exceed the value of its associated verify voltage $PPV_7$, then activity 952 sets the voltage of $V_{BL}$ at the associated data line to zero volts. Method 900 continues with activity 953 to finish setting of voltage $V_{BL}$ of that particular data line.

If the threshold voltage value of $VT_7$ in activity 951 exceeds the value of its associated verify voltage $PPV_7$, then activity 954 determines whether the threshold voltage value of $VT_7$ of the particular memory cell also exceeds the value of its associated verify voltage $PV_7$.

If the threshold voltage value of $VT_7$ in activity 954 exceeds the value of its associated verify voltage $PV_7$, then activity 955 sets the value of voltage $V_{BL}$ at the associated data line to a voltage $V_{INHBT}$. Method 900 continues with activity 953 to finish setting of voltage $V_{BL}$ of that particular data line.

If the threshold voltage value of $VT_7$ in activity 954 does not exceed the value of its associated verify voltage $PV_7$, then activity 956 determines whether the threshold voltage values of $VT_7$ of all L7 cells exceed the value of verify voltage $PPV_7$.

If the threshold voltage value of $VT_7$ of all L7 cells in activity 956 does not exceed the value of verify voltage $PPV_7$, then activity 957 sets the voltage of $V_{BL}$ at data lines associated with all L7 cells to approximately 350 millivolts. Method 900 continues with activity 953 to finish setting of voltage $V_{BL}$ data lines associated with all L7 cells.

If the threshold voltage value of $VT_7$ of all L7 cells in activity 956 exceeds the value of verify voltage $PPV_7$, then activity 958 sets the voltage of $V_{BL}$ at data lines associated with all L7 cells to approximately 200 millivolts or alternatively to zero volts (in activity 959). Method 900 continues with activity 953 to finish setting of voltage $V_{BL}$ data lines associated with all L7 cells.

Method 900 may return to activity 660 of FIG. 6 after it finishes setting data lines associated with all L7 cells.

Thus, in method 900 when all L0-L6 cells have reached their target threshold voltage values, method 900 may set the voltage of $V_{BL}$ at a data line associated with a memory cell among the L7 cells to zero volts, voltage $V_{INHBT}$, or a positive voltage (e.g., either 350 millivolts or 200 millivolts), based on a comparison of threshold voltage value of $VT_7$ with verify voltages $PPV_7$ and $PV_7$.

At the start of method 900, such as at activity 950, the data line associated with a particular memory cells among the L7 cells may have an intermediate voltage (e.g., 500 millivolts) applied to it by activity 745 of method 700 in FIG. 7, before all L0-L6 cells are finished programming. Thus, in FIG. 9, method 900 may decrease the value of voltage $V_{BL}$ at a data line from 500 millivolts to 350 millivolts in activity 957 and then continue with the programming. Method 900 may continue with the programming by applying a next programming pulse, such as programming pulse 405 in FIG. 5. In FIG. 9, if after a next programming pulse and activity 956 determines that all L7 cells exceed the value of verify voltage $PPV_7$, then method 900 may decrease the value of voltage $V_{BL}$ at a data line from 350 millivolts to 200 millivolts (activity 958) or alternatively from 350 millivolts to zero volts (activity 959).

Thus, as described above with reference to FIG. 9, when method 900 sets the value of $V_{BL}$ at a data line to 350 millivolts, 200 millivolts, or zero volts, method 900, in one situation, may decrease the value of voltage $V_{BL}$ at a data line from 500 millivolts to 350 millivolts and then from 350 millivolts to either 200 millivolts or zero volts. In another situation, method 900 may decrease the value of voltage $V_{BL}$ at a data line from 500 millivolts to either 200 millivolts or zero volts.

Figure 10:
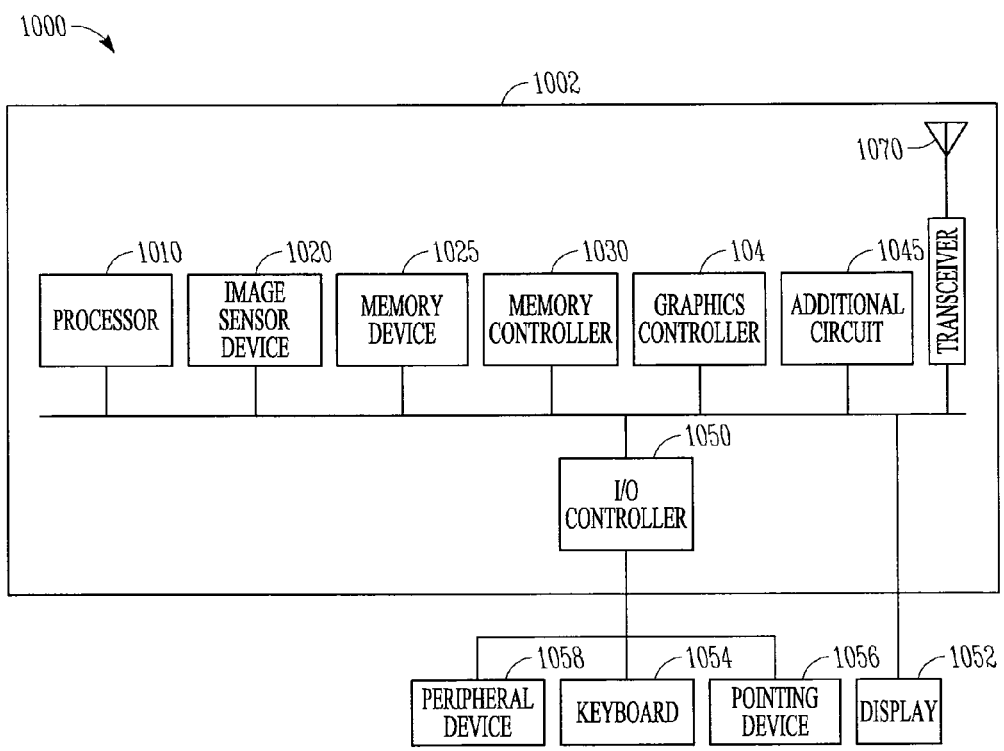
FIG. 10 shows a system according to an embodiment of the invention.

FIG. 10 shows a system 1000 according to an embodiment of the invention. System 1000 may include a processor 1010, an image sensor device 1020, a memory device 1025, a memory controller 1030, a graphics controller 1040, an additional circuit 1045, an input and output (I/O) controller 1050, a display 1052, a keyboard 1054, a pointing device 1056, a peripheral device 1058, a transceiver 1059, a bus 1060 to transfer information among the components of system 1000, and an antenna 1070 to wirelessly transmit and receive information to and from system 1000. Transceiver 1059 may operate to transfer information from one or more of the components of system 1000 (e.g., at least one of processor 1010 and memory device 1025) to antenna 1070. Transceiver 1059 may also operate to transfer information received at antenna 1070 to at least one of the processor 1010 and the memory device 1025. The information received at antenna 1070 may be transmitted to system 1000 by a source external to system 1000.

Processor 1010 may include a general-purpose processor or an application specific integrated circuit (ASIC). Processor 1010 may include a single core processor or a multiple-core processor. Processor 1010 may execute one or more programming commands to process information. The information may include digital output information provided by other components of system 1000, such as by image sensor device 1020 or memory device 1025.

Image sensor device 1020 may include a complementary metal-oxide-semiconductor (CMOS) image sensor having a CMOS pixel array or charge-coupled device (CCD) image sensor having a CCD pixel array.

Memory device 1025 may include a volatile memory device, a non-volatile memory device, or a combination of both. For example, memory device 1025 may comprise a dynamic random access memory (DRAM) device, a static random access memory (SRAM) device, a flash memory device, or a combination of these memory devices. Memory device 1025 may include one or more of the various embodiments described herein, such as memory devices 100 (FIG. 1) and 200 (FIG. 2).

Display 1052 may include an analog display or a digital display. Display 1052 may receive information from other components. For example, display 1052 may receive information that is processed by one or more of image sensor device 1020, memory device 1025, graphics controller 1040, and processor 1010 to display information such as text or images.

Additional circuit 1045 may include circuit components used in a vehicle. Additional circuit 1045 may receive information from other components to activate one or more subsystem of the vehicle. For example, additional circuit 1045 may receive information that is processed by one or more of image sensor device 1020, memory device 1025, and processor 1010, to activate one or more of an air bag system of a vehicle, a vehicle security alarm, and an obstacle alert system.

The illustrations of apparatus (e.g., memory devices 100 and 200) and systems (e.g., system 1000) are intended to provide a general understanding of the structure of various embodiments and are not intended to provide a complete description of all the elements and features of apparatus and systems that might make use of the structures described herein.

Any of the components described above can be implemented in a number of ways, including simulation via software. Thus, apparatus (e.g., a portion of memory device 100 or the entire memory device 100, and portion of memory device 200 or the entire memory device 200) and systems (e.g., a portion of system 1000 or the entire system 1000) described above may all be characterized as "modules" (or "module") herein. Such modules may include hardware circuitry, single and/or multi-processor circuits, memory circuits, software program modules and objects and/or firmware, and combinations thereof, as desired by the architect of the apparatus (e.g., memory devices 100 and 200) and systems (e.g., system 1000), and as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

The apparatus and systems of various embodiments may include or be included in electronic circuitry used in high-speed computers, communication and signal processing circuitry, single or multi-processor modules, single or multiple embedded processors, multi-core processors, data switches, and application-specific modules including multilayer, multi-chip modules. Such apparatus and systems may further be included as sub-components within a variety of electronic systems, such as televisions, cellular telephones, personal computers (e.g., laptop computers, desktop computers, hand-held computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 10 include memory devices and methods of programming memory cells of the memory device. One such method includes applying voltages to data lines associated with different groups of memory cells during a programming operation. One such method applies the voltages to the data lines associated with a last group of memory cells being programmed in a different fashion from the other groups of memory cells after the other groups of memory cells have been programmed. Other embodiments including additional memory devices and methods are described.

The above description and the drawings illustrate some embodiments of the invention to enable those skilled in the art to practice the embodiments of the invention. Other embodiments may incorporate structural, logical, electrical, process, and other changes. In the drawings, like features or like numerals describe substantially similar features throughout the several views. Examples merely typify possible variations. Portions and features of some embodiments may be included in, or substituted for, those of others. Many other embodiments will be apparent to those of skill in the art upon reading and understanding the above description.

The Abstract is provided to comply with 37 C.F.R. §1.72(b) requiring an abstract that will allow the reader to quickly ascertain the nature and gist of the technical disclosure. The Abstract is submitted with the understanding that it will not be used to interpret or limit the scope or meaning of the claims.

What is claimed is:

1. A method comprising:
   programming a first group of memory cells;
   increasing a value of a voltage applied to a data line associated with a memory cell of a second group of memory cells when a programming voltage is applied to an access line associated with the memory cell if a voltage value of the memory cell is greater than a first verify voltage value associated with the second group of memory cells and if the voltage values of the first group of memory cells have reached their respective target voltage values; and
   decreasing the value of the voltage applied to the data line when the programming voltage is applied to the access line if the voltage value of the memory cell is greater than the first verify voltage value and less than a second verify voltage value, and if voltage values of the first group of memory cells have reached their respective target voltage values.

2. The method of claim 1, wherein the target voltage value of the memory cell of the second group of memory cells is greater than each of the target voltage values of the first group of memory cells.

3. The method of claim 1, wherein increasing includes changing the value of the voltage applied to the data line from a ground potential to a first value greater than the ground potential.

4. The method of claim 3, wherein decreasing includes changing the value of the voltage applied to the data line from the first value to the ground potential.

5. The method of claim 2, wherein decreasing includes changing the value of the voltage applied to the data line from a first value to a value greater than the ground potential.

6. The method of claim 1, further comprising:
   applying at least one programming pulse to an access line associated with the first and second groups of memory cells before a voltage value of each memory cell of the second group of memory cells is greater than the first verify voltage value; and
   applying only one additional programming pulse to the access line after the voltage value of each memory cell of the second group of memory cells is greater than the first verify voltage value.

7. The method of claim 1, further comprising:
   applying programming pulses to an access line associated with the first and second groups of memory greater than the first verify voltage value; and
   not applying any additional programming pulses to the access line after the voltage value of each memory cell of the second group of memory cells is greater than the first verify voltage.

8. A method comprising:
   programming substantially concurrently a first group of memory cells associated with an access line and a second group of memory cells associated with the access line;
   determining whether voltage values of memory cells in the first group of memory cells have reached their respective target threshold voltage values during the programming;
   if at least one of the memory cells in the first group has a voltage value that has not reached the respective target voltage value, applying an intermediate voltage to at least one data line of a plurality of data lines associated with the first and second groups of memory cells;
   if the voltage values of all memory cells of the first group of memory cells have reached their respective target voltage values, decreasing a value of the intermediate voltage applied to at least one data line associated with at least one memory cell of the second group of memory cells when a programming voltage is applied to the access line if the at least one cell has a voltage value greater than a first verify voltage value associated with the second group of memory cells and less than a second verify voltage value associated with the second group of memory cells; and
   continuing the programming at least until voltage values of all memory cells of the second group of memory cells are greater than the second verify voltage value.

9. The method of claim 8, wherein applying the intermediate voltage includes applying the intermediate voltage to a data line associated with a memory cell of the second group of memory cells if a voltage value of the memory cell during the programming is greater than the first verify voltage value and less than the second verify voltage value.

10. The method of claim 9, wherein decreasing the value of the intermediate voltage includes decreasing the value of the intermediate voltage from a first value to a second value greater than a ground potential if a voltage value of any memory cell of the second group of memory cells remaining to be programmed is less than the first verify voltage value.

11. The method of claim 10, wherein decreasing the value of the intermediate value includes decreasing the first value to a third value greater than the ground potential and less than the second value if the voltage value of each memory cell of second group of memory cells remaining to be programmed is greater than the first verify voltage value.

12. The method of claim 11, wherein the second value of the intermediate voltage is approximately 350 millivolts.

13. The method of claim 12, wherein the third value of the intermediate voltage is approximately 200 millivolts.

14. A device comprising:
   a first group of memory cells and a second group of memory cells;
   an access line coupled to access the first and second groups of memory cells; and
   a module configured to increase a value of a voltage applied to a data line associated with a memory cell of the second group of memory cells when a programming voltage is applied to the access line if a voltage value of the memory cell during a programming operation is greater than a first verify voltage value associated with the second group of memory cells and if the voltage values of the first group of memory cells have reached their respective target voltage values, the module further configured to decrease the value of the voltage applied to the data line when the programming voltage is applied to the access line if the voltage value of the memory cell is greater than the first verify voltage value and less than a second verify voltage value, and if voltage values of the first group of memory cells have reached their respective target voltage values.

15. The device of claim 14, wherein the module is configured to decrease the value of the voltage applied to the data line by changing the value of the voltage applied to the data line from a positive value to a ground potential.

16. The device of claim 14, wherein the module is configured to decrease the value of the voltage applied to the data line by changing the value of the voltage applied to the data line from a first positive value to a second positive value less than the first positive value and greater than a ground potential.

* * * * *